United States Patent [19]

Braitberg et al.

[11] 3,976,354
[45] Aug. 24, 1976

[54] HOLOGRAPHIC MEMORY WITH MOVING MEMORY MEDIUM

[75] Inventors: Michael F. Braitberg, Littleton, Colo.; Tzuo-Chang Lee, Bloomington, Minn.

[73] Assignee: Honeywell Inc., Minneapolis, Minn.

[22] Filed: Dec. 14, 1974

[21] Appl. No.: 424,991

[52] U.S. Cl. .................................................. 350/3.5
[51] Int. Cl.² ................. G03H 1/16; G03H 1/18; G03H 1/28
[58] Field of Search ............... 350/3.5, 162 SF; 346/77 E, 74 TP; 355/9; 96/1.1; 178/6.6 TP; 340/173 TP

[56] References Cited
UNITED STATES PATENTS

| 3,453,640 | 7/1969 | Blackmer | 350/162 R |
| 3,580,655 | 5/1971 | Leith | 350/3.5 |
| 3,635,545 | 1/1972 | Vankerkhove et al. | 350/3.5 |
| 3,643,017 | 2/1972 | Pekau | 350/3.5 |
| 3,754,807 | 8/1973 | McMahon et al. | 350/3.5 |
| 3,812,496 | 5/1974 | Brooks | 350/3.5 |
| 3,821,722 | 6/1974 | Ost | 350/3.5 |

OTHER PUBLICATIONS

Blackmer et al., Applied Optics, vol. 9, No. 12, Dec. 1970, pp. 2753–2761.

*Primary Examiner*—John K. Corbin
*Assistant Examiner*—Jon W. Henry
*Attorney, Agent, or Firm*—David R. Fairbairn

[57] ABSTRACT

In a holographic memory or a holographic recording system, one dimensional Fourier transform holograms are recorded on a moving memory medium. The one dimensional Fourier transform holograms have their elongated dimension oriented in a direction which is essentially normal to the direction of motion of the memory medium

9 Claims, 9 Drawing Figures

HOLOGRAPHIC MEMORY WITH MOVING MEMORY MEDIUM

BACKGROUND OF THE INVENTION

This invention relates to holography, and in particular to a holographic memory and a holographic recording system. A holographic memory makes use of a memory medium upon which many individual holograms are stored. Each hologram represents a different bit pattern or "page". Information is stored by directing an information beam and a reference beam to a desired location on the memory medium. The information beam, which contains a bit pattern formed by a page composer, interferes with the reference beam to form the hologram. To read out the information, a readout beam selectively illuminates one of the holograms stored, thereby producing a reconstructed image of the bit pattern stored in the hologram. An array of photodetectors is positioned to detect the individual bits of the reconstructed bit pattern.

The holographic memory is an extremely attractive form of mass memory. In a "bit-by-bit" type of optical memory, a single recorded spot on the memory medium represents only one information bit. In a holographic memory, on the other hand, a single hologram on the same memory medium may represent a page containing as many as $10^5$ bits. Memories having $10^5$ or $10^6$ pages have been proposed, with each page containing about $10^5$ bits.

Another advantage of the holographic memory is that the information stored in the hologram is stored uniformly throughout the hologram rather than in discrete areas. The hologram is thus relatively insensitive to blemishes or dirt on the memory medium. A small blemish or dust particle on the memory medium cannot obscure a bit of digital data as it can in a bit-by-bit memory.

Despite substantial research efforts over the last several years, holographic memories have not yet achieved their potential. Development of a holographic memory having a memory capacity of $10^{10}$ to $10^{11}$ bits has been hampered by limitations in the performance of some of the components of the holographic memory. In particular, difficulties have been encountered with the light beam deflectors and page composers required for a high capacity holographic memory. Present day light beam deflection technology is not capable of providing the large number of resolvable beam positions at access rates which are acceptable for a large scale holographic memory. In addition, a satisfactory page composer capable of producing a two dimensional array of $10^4$ or $10^5$ bits has not yet been developed. Such a large scale page composer presents difficult problems in addressing various bits. If row by row addressing is used to shorten the composing or setup time of the array of bits, the optically active page composer material must also exhibit memory characteristics. A page composer meeting these various conflicting requirements has presented a challenge to researchers.

SUMMARY OF THE INVENTION

The holographic system of the present invention overcomes some of the limitations caused by components of prior art holographic memories. In particular, a light beam deflection system capable of a large number of resolvable spots is not required. In addition, the requirements for the page composer are greatly relaxed.

The improved holographic system of the present invention is achieved by the use of the moving memory medium. One dimensional Fourier transform holograms are stored on the moving memory medium. The one dimensional Fourier transform holograms have their elongated dimension oriented in a first direction and the interference fringe lines oriented in a second essentially orthogonal direction. The memory medium moves in essentially the second direction.

As used in this specification, the term "one dimensional Fourier transform hologram" refers to a Fourier transform hologram having a first dimension which is much larger than the second dimension. This first dimension is referred to as the "elongated" dimension. A one dimensional Fourier transform hologram may be formed from a one dimensional array of bits, or from an array of bits organized in an $m \times n$ matrix, where $m$ is much larger than $n$.

DESCRIPTION OF THE PREFERRED EMBODIMENTS

Figure 1:
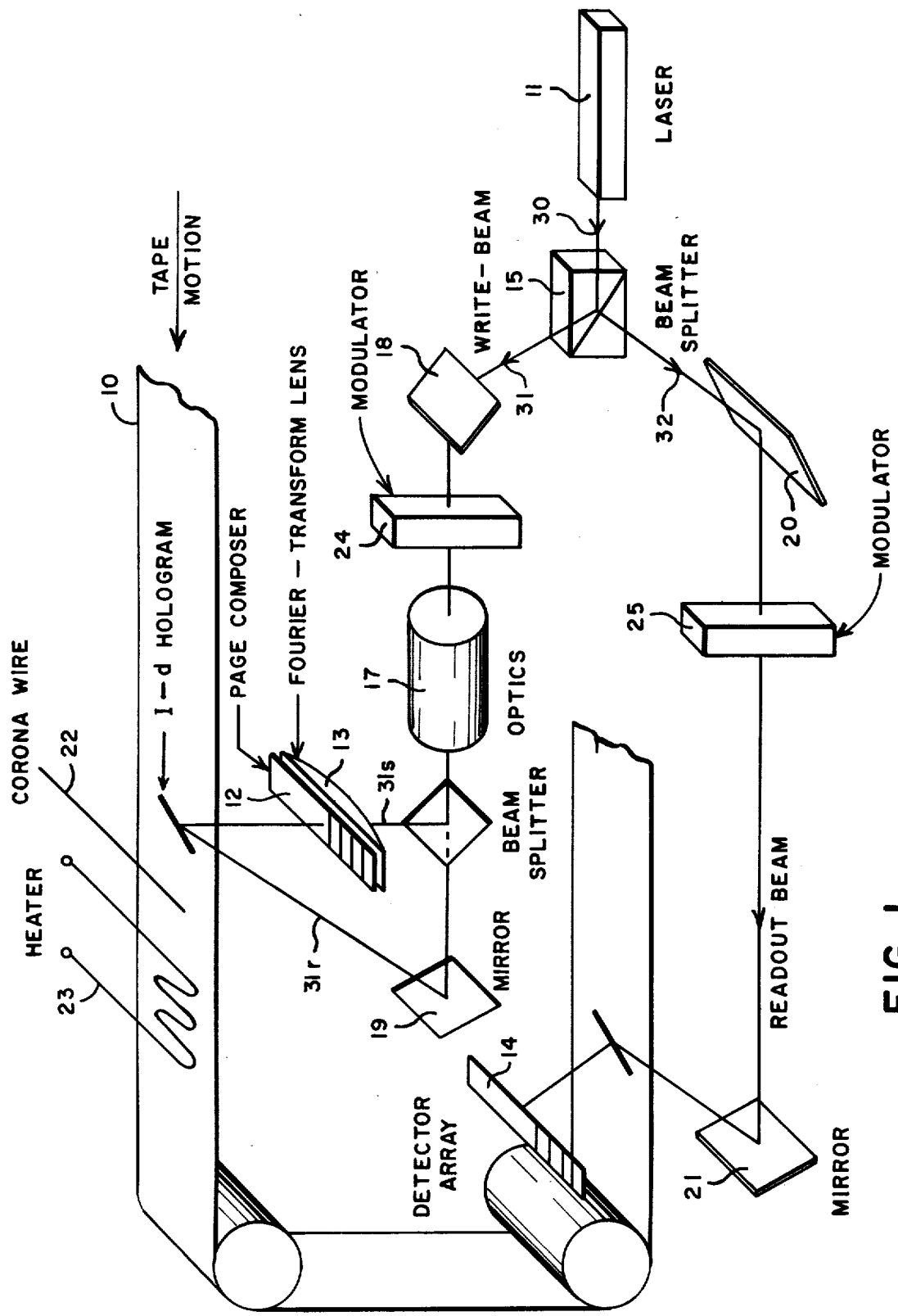
FIG. 1 is a block diagram of one embodiment of the holographic system of the present invention.

FIG. 1 is a block diagram of a holographic memory in which one dimensional Fourier transform holograms are stored in a moving memory medium 10. As shown in FIG. 1, memory medium 10 is in the form of a tape. The holographic memory includes light source 11, page composer 12, Fourier transform lens 13, photodetector array 14, beam splitters 15 and 16, beam focusing optics 17, and mirrors 18, 19, 20, and 21. Modulators 24 and 25 may also be provided in write beam 31 and read beam 32, respectively.

When memory medium 10 is a thermoplastic-photoconductor structure, an electrical charging means, which is shown as corona wire 22, and a heater 23 are also required to form the hologram. Means for proper electrical grounding of the thermoplastic-photoconductor should also be provided. Grounding is required so that the charged ions from the corona wire 22 are attracted to the thermoplastic.

Light source 11 produces a light beam 30 which is split by Glan prism beam splitter 15 into write beam 3 and read beam 32. Write beam 31 is then split by beam splitter 16 into signal beam 31s and reference beam 31r. Signal beam 31s passes through page composer 12, which creates an elongated bit pattern in signal beam 31s. Fourier transform lens 13 produces a one dimensional Fourier transform of the elongated bit pattern at memory medium 10. Reference beam 31r and signal beam 31s interfere at memory medium 10 to produce a one dimensional Fourier transform hologram.

Figure 2:
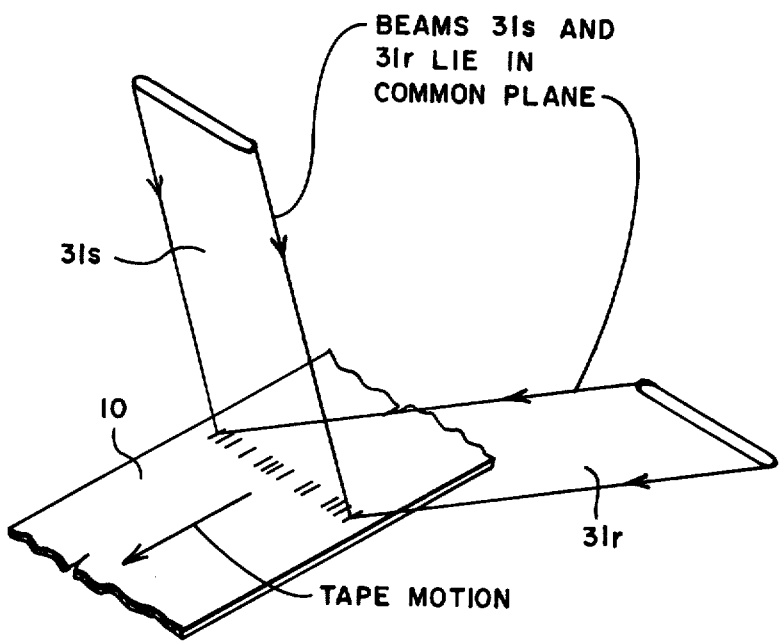
FIG. 2 shows the intersection of the reference and signal beams at the memory medium.

As shown in FIG. 2, the orientation of reference beam 31r and signal beam 31s is such that two requirements are met. The first requirement is that the hologram which is stored on memory medium 10 be a one dimensional Fourier transform hologram having its elongated dimension essentially normal to the direction of motion of the memory medium. This orientation of the Fourier transform hologram is important because it yields the highest packing density of holograms.

The second, and even more important, requirement is that the interference fringes of the hologram run parallel to the tape motion. The importance of having the interference fringes running parallel to the motion of the memory medium is illustrated by FIGS. 3a through 3d.

Figure 3A:
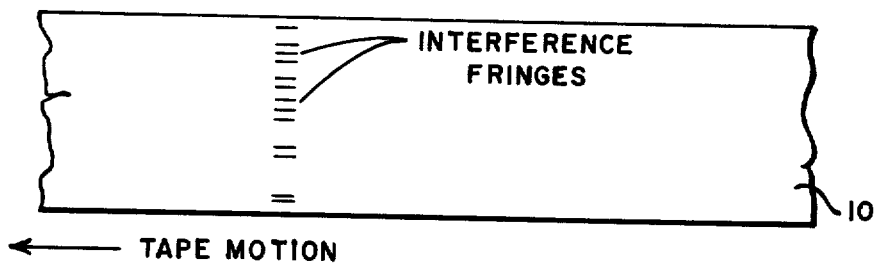
FIGS. 3a, 3b, 3c, and 3d illustrate the interference fringes obtained from one dimensional Fourier transform holograms.
Figure 3B:
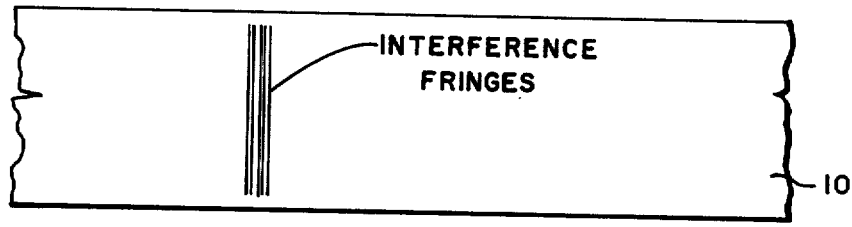

FIGS. 3a and 3b show one dimensional Fourier transform holograms having their elongated dimension essentially normal to the direction of motion of the memory medium. In both FIGS. 3a and 3b, the information is stored in a direction perpendicular to the tape motion. In FIG. 3a, the interference fringes are essentially parallel to the direction of motion. In FIG. 3b, on the other hand, the interference fringes are perpendicular to the direction of motion. It can be seen that the recording requirements for the Fourier transform hologram of FIG. 3a are much less stringent than those for the hologram of FIG. 3b. In FIG. 3b the interference fringes are perpendicular to the direction of motion, so that the maximum exposure time for recording the hologram must be less than the time in which the memory medium moves a fraction of an interference fringe. In FIG. 3a, on the other hand, the interference fringes run parallel to the direction of motion so that the maximum exposure time may be much longer without adversely affecting the hologram.

Figure 3C:
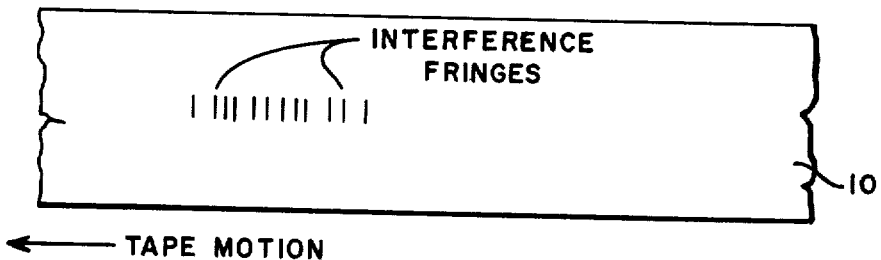
Figure 3D:
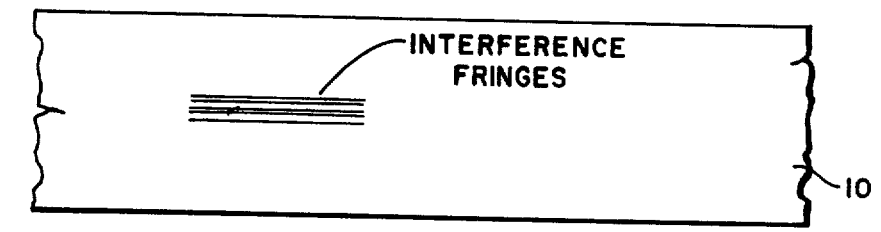

FIGS. 3c and 3d have their elongated dimension parallel to the tape motion. In FIG. 3c, fringes are perpendicular to the tape motion; in FIG. 3d, the interference fringes are parallel to the tape motion. In each case, however, the information is stored along the direction of tape motion. As a result, the holograms of FIGS. 3c and 3d are subject to the same stringent recording requirements described with respect to FIG. 3b.

Figure 4:
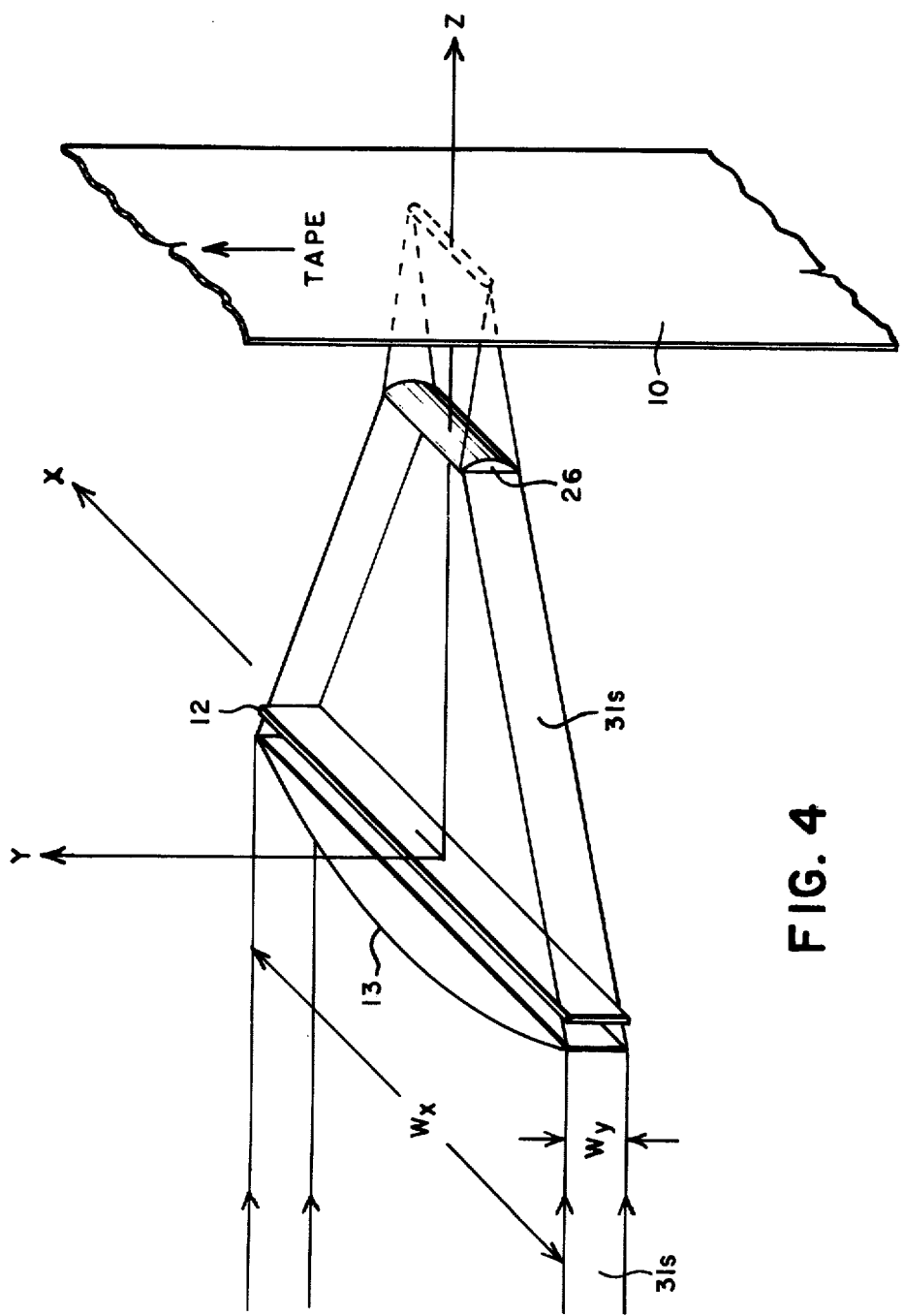
FIG. 4 shows the optics used in conjunction with the page composer to form a one dimensional Fourier transform hologram.

FIG. 4 shows one configuration for producing signal beam 31s. Cylindrical Fourier transform lens 13 converges signal beam 31s along the x dimension, while cylindrical lens 26 converges signal beam 31s in the y dimension.

Readout of the holograms is achieved by read beam 32. Mirrors 20 and 21 direct read beam 32 to a one dimensional hologram on memory medium 10. The diffracted portion of read beam 32 produces a reconstructed image of the bit pattern stored in the hologram. Detector array 14, which is an X n array of detectors, is positioned to receive the reconstructed image of the bit pattern. As shown in FIG. 1, read beam 32 is preferably the complex conjugate of reference beam 31r, so that a real image readout is obtained. This eliminates the need for a readout lens.

Figure 5:
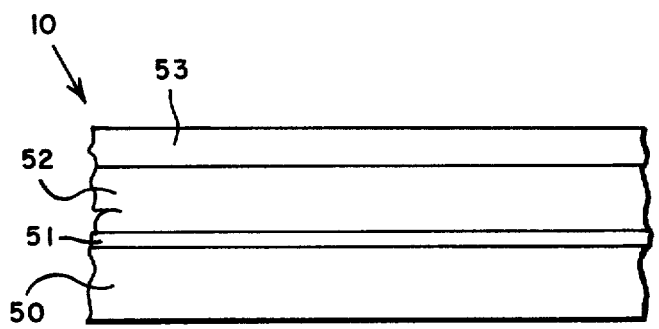
FIG. 5 is a cross sectional view of the thermoplasstic-photoconductor memory medium which may be used in any holographic system of FIG. 1.

Although memory medium 10 may be made of any material which is capable of storing holograms, the preferred memory medium is a thermoplastic-photoconductor structure similar to that shown in FIG. 5. The memory medium comprises a transparent film base 50, transparent conductor 51, photoconductive layer 52, and thermoplastic layer 53. The principles of holographic storage on a thermoplastic-photoconductor memory medium have been discussed by L. H. Lin and H. L. Beauchamp, "Read-Write-Erase in Situ Optical Memory Using Thermoplastic Holograms", *Applied Optics*, 9, 2088 (1970); J. C. Urbach and R. W. Meier, "Thermoplastic Xerographic Holography", *Applied Optics*, 5, 666 (1966); and P. L. Credell and F. W. Spong, "Thermoplastic Media for Holographic Recording", *RCA Review*, 33, 206 (1972). The basic operational steps of holographic recording on a thermoplastic-photoconductor are electrostatic charging, exposure, recharging, and heat development. In FIG. 1, the charging and recharging steps are performed by the corona wire 22, the exposure step is performed by reference beam 31r and signal beam 31s, and the heat development step is performed by heater 23.

Holographic recording on a thermoplastic-photoconductor structure has several advantages. First, the resultant hologram is a phase hologram having a high readout efficiency, typically 10 to 20%. Second, the hologram recorded in the thermoplastic can be erased by a heat pulse having a duration which is longer than that used for development of the hologram. The ability to erase recorded holograms allows the system to be used for alterable holographic storage.

The system shown in FIG. 1 overcomes two of the obstacles encountered in the development of a holographic memory. The limitations in present day deflector technology do not affect the performance of the holographic memory since no light beam deflector is required. Individual holograms are addressed by the use of a moving memory medium.

The requirements for a page composer are greatly simplified in the holographic memory of the present invention. Unlike other holographic memories, which use a two dimensional page composer, the holographic memory of the present invention preferably uses a one dimensional page composer.

The use of a one dimensional page composer greatly simplifies the electrode configuration, since individual leads are easily connected in a one dimensional array. In addition, parallel addressing may be used to reduce the composing time of the page composer without requiring a page composer material having memory capability. For this reason, slim loop PLZT material or liquid crystals may be used as the page composer material for one dimensional page composers. In a two dimensional page composer, on the other hand, the page composer material must exhibit memory capability if parallel addressing is to be used.

Figure 6:
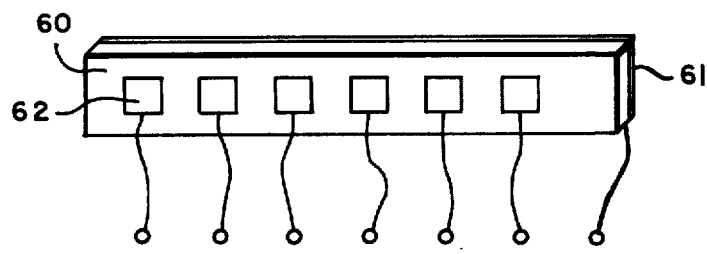
FIG. 6 shows a one dimensional page composer which may be used in the holographic system of FIG. 1.

FIG. 6 shows a page composer which can be used with the system of FIG. 1. The page composer is formed by a body 60 of electro-optic material, such as lanthanum-modified lead zirconate titanate (PLZT) ceramic. A transparent base electrode 61 covers the back surface of electro-optic body 60. On the front surface, individual transparent conductors 62 are formed. The portion of electro-optic body 60 between each of the individual transparent conductors 62 and base electrode 61 forms an individual light valve. The individual light valves are controlled by the application of an electric field between a transparent conductor 62 and base electrode 61.

In conclusion, the present invention is a holographic system having many advantages over prior art systems. First, the memory medium is transportable, replaceable, storable, alterable, and interchangeable. Second, the holographic system of the present invention does not require a light beam deflection system capable of a large number of resolvable spots. Third, the system greatly reduces the requirements for the page composer. Fourth, the system of the present invention achieves non-contact recording and reading on a tape. This eliminates the mechanical wear problems which are found in magnetic tape recorders. Fifth, the reference beam may be coded so that security of the recorded information is achieved so long as the code is secret.

Although the present invention has been described in terms of a series of preferred embodiments, workers skilled in the art will recognize that many modifications may be made without departing from the spirit and scope of the invention. For example, although the memory medium has been shown as a tape, it may also be in the form of a moving disc or drum. In each case, however, the one dimensional Fourier transform holograms which are recorded have their elongated dimension oriented essentially normal to the direction of motion of the memory medium, and the fringe lines are essentially parallel to the direction of motion.

Semiconductor lasers are one advantageous light source which may be used with the present invention since the beam profile from a semiconductor laser is typically elongated. This may simplify the design of the optics for recording and for readout.

Although corona charging has been specifically shown and described, other charging techniques may also be used. For example, triboelectric charging may be used.

Still another possible modification is the use of a separate system for reading the hologram from the tape. In other words, the holograms need not be read on the same system on which they were recorded.

The embodiments of the invention in which an exclusive property or right is claimed are defined as follows:

1. A holographic system comprising:
   a memory medium for storing holograms;
   light source means for producing mutually coherent elongated signal and reference beams;
   page composer means positioned in the path of the elongated signal beam for creating an elongated bit pattern in the signal beam, the elongated bit pattern containing a plurality of bits arranged in an essentially linear array;
   Fourier transform means for producing a one-dimensional Fourier transform of the elongated bit pattern at the memory medium;
   beam directing means for directing the signal and reference beams to a common position at the memory medium whereby the signal and reference beams interfere to store a one-dimensional Fourier transform hologram having interference fringe lines and an elongated dimension, the elongated dimension being oriented in a first direction and the interference fringe lines being oriented in a second, essentially orthogonal direction;
   means for providing relative motion of the memory medium with respect to the signal and reference beams essentially in the second direction.

2. The holographic system of claim 1 and further comprising:
   readout beam source means for producing a readout beam;
   readout beam directing means for directing the readout beam to a recorded hologram on the memory medium; and
   detector array for receiving the reconstructed image of the hologram produced by a diffracted portion of the readout beam.

3. The holographic memory of claim 2 wherein the readout beam directing means directs the readout beam to a hologram such that the readout beam is essentially the complex conjugate of the reference beam used to store the hologram.

4. The holographic memory of claim 1 wherein the memory medium is a tape.

5. The holographic memory of claim 4 wherein the memory medium comprises thermoplastic and photoconductive layers deposited on a tape.

6. The holographic memory of claim 5 and further comprising:
   charging means for depositing an electrical charge on thesurface of the memory medium prior to exposure of the memory medium to the signal and reference beams; and
   heater means for heating the thermoplastic to soften the thermoplastic whereby a deformation pattern corresponding to the one dimensional Fourier transform hologram is formed.

7. The holographic memory of claim 6 wherein the charging means comprises a corona source.

8. The holographic system of claim 6 wherein the charging means comprises triboelectric charging means.

9. The holographic system of claim 5 wherein the memory medium comprises thermoplastic and photoconductor layers deposited on a tape coated with a conductive layer.

* * * * *